Feb. 20, 1968 R. L. OVERSTREET, JR 3,370,251
PLURAL OSCILLATORS WITH A CIRCUIT TO IDENTIFY
A MALFUNCTIONING OSCILLATOR
Filed Dec. 9, 1966 2 Sheets-Sheet 1

| OUTPUT FROM 17 | 18 | 24 | 25 | 26 | RELAY OPERATED | LAMP ON |
|---|---|---|---|---|---|---|
| 0 | 0 | 0 | 0 | 0 | | |
| 1 | 0 | 1 | 1 | 0 | K | SLAVE |
| 0 | 1 | 1 | 0 | 1 | M | REFER. |
| 1 | 1 | 0 | 1 | 1 | L | MASTER |

INVENTOR
R. L. OVERSTREET, JR.
BY H. L. Logan
ATTORNEY

Feb. 20, 1968 R. L. OVERSTREET, JR 3,370,251

PLURAL OSCILLATORS WITH A CIRCUIT TO IDENTIFY A MALFUNCTIONING OSCILLATOR

Filed Dec. 9, 1966 2 Sheets-Sheet 2

3,370,251
PLURAL OSCILLATORS WITH A CIRCUIT TO IDENTIFY A MALFUNCTIONING OSCILLATOR

Robert L. Overstreet, Jr., Burlington, N.C., assignor to Bell Telephone Laboratories, Inc., Berkeley Heights, N.J., a corporation of New Jersey Filed Dec. 9, 1966, Ser. No. 600,600
4 Claims. (Cl. 331—55)

This invention relates to identifying a malfunctioning oscillator in a group of supposedly phase-locked oscillators.

Several techniques for producing highly reliable timing or clocking waveforms are disclosed in applicant's copending application Ser. No. 568,464, filed on July 28, 1966. In general, this previously filed application teaches the use of logic circuitry to combine the outputs of a plurality of phase-locked oscillators so that the malfunctioning of any one oscillator does not adversely affect the desired output. Notwithstanding this improved operation, it nevertheless would be desirable to be able either to repair or replace the faulty oscillator as further malfunctions could result in output failure. The present invention is directed toward the accomplishment of this result.

An object of the present invention is to identify a malfunctioning oscillator in a group of supposedly phase-locked oscillators.

In accordance with the invention, when two oscillators are each supposedly phase-locked to a master oscillator but one of the three oscillators is malfunctioning, the malfunctioning oscillator is identified by the voltages attempting to effect the two phase-lockings. In particular, deviations from norms in both phase-locking voltages are recognized as an indication that the master oscillator is malfunctioning, while a deviation in only one of the phase-locking voltages is recognized as an indication that the nonmaster oscillator partially responsible for that phase-locking voltage is malfunctioning. Although various circuit configurations may be used to perform this recognition, a particular arrangement is disclosed in the accompanying drawings and, further, is considered in detail in the following discussion.

Figures 1A, 1B:
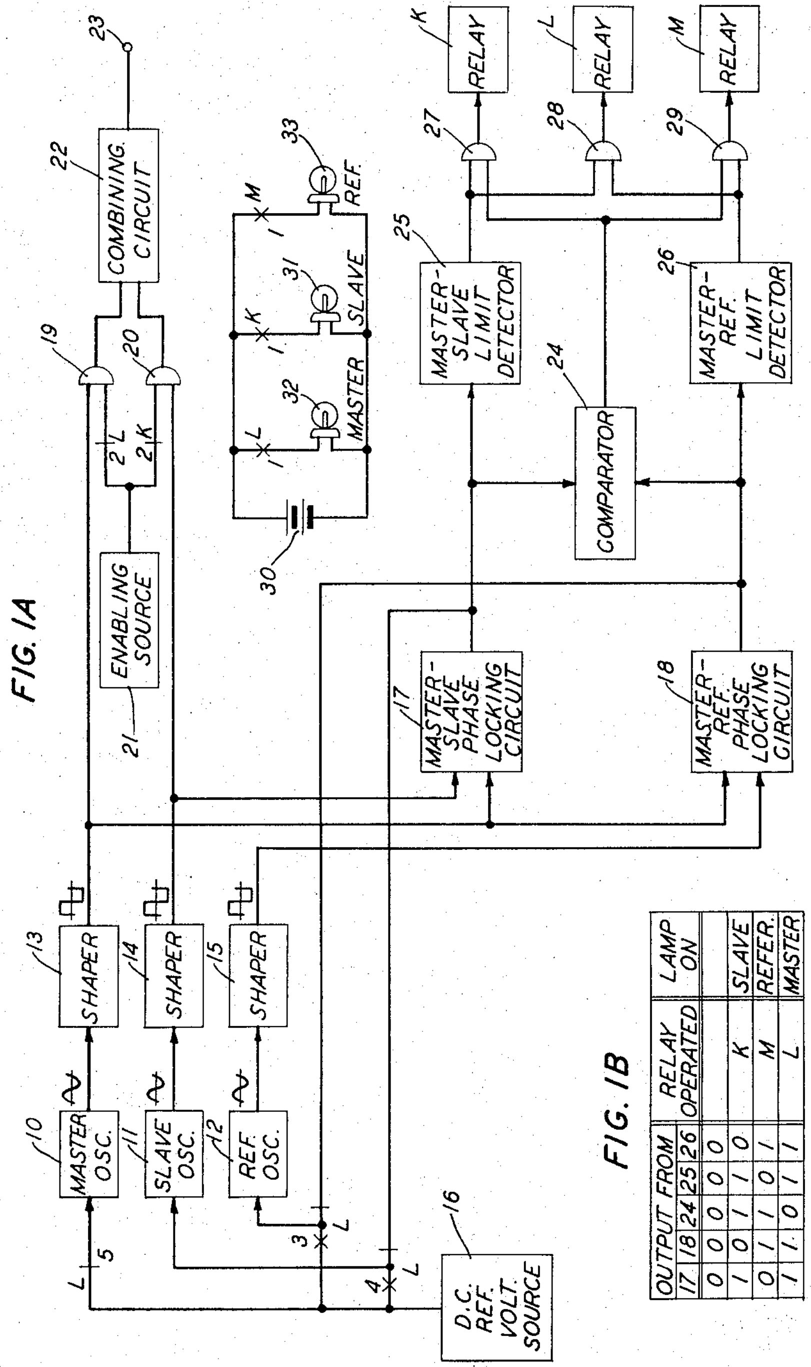
FIG. 1A is a block diagram of a reliable timing or clocking source that includes an embodiment of the present invention.
FIG. 1B is a table used in explaining the operation of the source of FIG. 1A.

The source of FIG. 1 includes three sine wave oscillators, namely, a master oscillator 10, a slave oscillator 11 and a reference oscillator 12. Outputs from these oscillators are shaped into square waves by three wave shapers 13, 14 and 15, respectively. The frequency of master oscillator 10 is normally controlled by a direct-current reference voltage source 16 while the frequencies of oscillators 11 and 12 are controlled by a master-slave phase-locking circuit 17 and a master-reference phase-locking circuit 18. The phase-locking loops are completed by applying the outputs of shapers 13, 14 and 15 to phase-locking circuits 17 and 18.

The outputs of shapers 13 and 14 are also applied to a pair of AND gates 19 and 20 which are normally in enabled states in response to a voltage from an enabling source 21. Outputs from AND gates 19 and 20 are combined in a combining circuit 22 whose output, in turn, appears at an output terminal 23. Combining circuit 22 produces a continuous output even though the output from one of gates 19 and 20 remains in either a binary zero or one state. Combining circuits of this type form the principal subject matter of applicant's previously mentioned copending application.

The outputs from phase-locking circuits 17 and 18 are also applied to a comparator 24 which produces an output when the phase-locking circuit outputs differ by a predetermined amount. The phase-locking circuit outputs are still further applied to a master-slave limit detector 25 and a master-reference limit detector 26. These detectors produce outputs when their inputs fall outside of predetermined ranges. An AND gate 27 responds to outputs from detector 25 and comparator 24; an AND gate 28 responds to outputs from detectors 25 and 26; and, an AND gate 29 responds to outputs from comparator 24 and detector 26. The outputs of AND gates 27, 28 and 29, in turn, operate relays K, L and M, respectively. The operation of relays K, L and M apply voltage from a battery through relay contacts 1 to slave-master and reference lamps 31, 32 and 33, respectively, thereby producing an indication of the faulty oscillator. (The contacts for relays K, L and M are not shown immediately adjacent to the blocks identified as relays K, L and M, but instead are shown in the conventional detached form.)

Relays L and K perform functions in addition to energizing lamps 31 and 32. When operated, relay L effectively removes oscillator 10 from the over-all circuit by opening its contacts 2 to remove the enabling voltage from AND gate 19 and by opening its contacts 5 to disconnect source 16 from master-oscillator 10. It also operates its contacts 3 and 4 to transfer oscillators 11 and 12 from the phase-locking circuit outputs to source 16 output. On the other hand, when operated, relay K performs the additional function of removing the enabling voltage from AND gate 20 by opening its contacts 2.

The requirements for the operation of relays K, L and M may be better understood by referring to the table shown in FIG. 1B. The absence of error outputs from the combination elements 17, 18, 24, 25 and 26 is indicated by binary zeroes, while the presence of error outputs is indicated by binary ones. When all oscillators are functioning correctly, phase-locking circuits 16 and 17 produce a zero-zero combination and none of the relays is operated. When slave-oscillator 11 malfunctions, a one-zero combination is produced because this oscillator only affects the output of phase-locking circuit 17. This one-zero combination causes comparator 24 and detector 25 to produce ones, which, in turn, causes AND gate 27 to operate relay K. When reference-oscillator 12 malfunctions, a zero-one combination occurs because this oscillator only affects the output of phase-locking circuit 18. This combination causes comparator 24 and detector 26 to produce ones, which, in turn, cause AND gate 29 to operate relay M. Finally, failure of master-oscillator 10 causes a one-one combination because both of phase-locking circuits 17 and 18 are affected. Since both inputs to comparator 24 deviate to the same degree, its output remains a zero. The outputs of detectors 25 and 26 are both ones, however, and AND gate 28 causes relay L to operate. Malfunctioning of any one of the oscillators is thus recognized.

Figure 2:
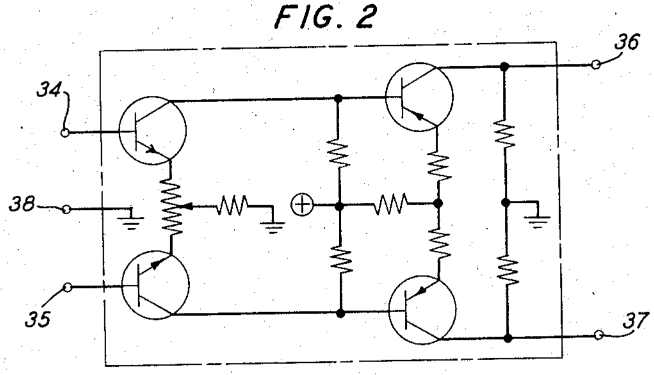
FIG. 2 is a schematic diagram of a balanced amplifier used in the block diagrams of FIGS. 3, 4 and 5.

The balanced amplifier illustrated in schematic form in FIG. 2 may be used in constructing circuitry for combination elements 17, 18, 24, 25 and 26 of FIG. 1A. The manner in which this amplifier may be used to achieve these purposes is discussed with respect to FIGS. 3, 4 and 5. First, however, a few comments are presented with respect to FIG. 2.

The balanced amplifier of FIG. 2 is essentially identical to one disclosed and discussed in Semiconductor Circuit Analysis, by Phillip Cutler (McGraw Hill, 1964), page 378, FIGS. 6–38. (The only difference between the amplifiers is that the negative supply of the textbook has been replaced by ground connections.) For purposes of explanation, the ungrounded input terminals of FIG. 2 are identified as 34 and 35, the ungrounded output terminals are identified as 36 and 37 and the ground terminal is identified as 38. Very briefly, each half of the amplifier comprises two direct-coupled complementary transistors, with shared resistors between the amplifier halves for cross-coupling purposes. At any one time, one of the output transistors will be conducting to produce a positive potential at its output terminal while the other output transistors will be nonconducting to produce a ground potential at its output terminal. Because of cross-coupling provided by the shared resistors, switching back and forth between these two output states occurs at approximately a 10 millivolt difference between potentials applied to input terminals 34 and 35. Further details with respect to this circuit appear in the textbook.

Figure 3:
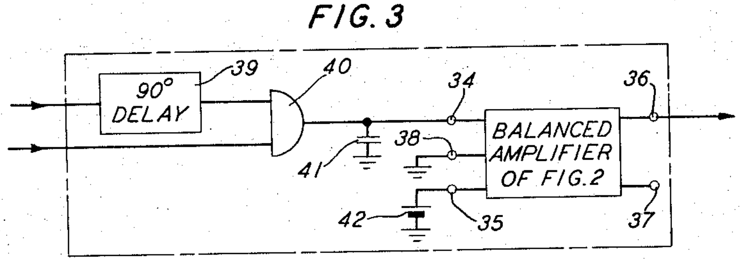
FIGS. 3, 4 and 5 are block diagrams of a phase-locking circuit, a comparator and a limit detector, respectively, that may be used in the embodiment of FIG. 1.

FIG. 3 shows one form of phase-locking circuit that may be used for phase-locking circuits 17 and 18 of FIG. 1A. One input is applied through a 90° delay circuit 39 to an AND gate 40 while the other input is applied directly to the gate. The output of gate 40 is integrated by a capacitor 41 to produce a voltage which is a function of the amount of overlapping of the two inputs to the AND gate. The capacitor voltage is applied to terminal 34 of a balanced amplifier of the configuration shown in FIG. 2 while a grounded battery 42 is connected to terminal 35 of the amplifier. The over-all circuit output appears at amplifier output terminal 36. In this use of the balanced amplifier of FIG. 2, the potential at terminal 36 varies about a nominal positive value; that is, the relative levels of the amplifier inputs do not normally invert to produce the previously referred to switching action.

Figure 4:
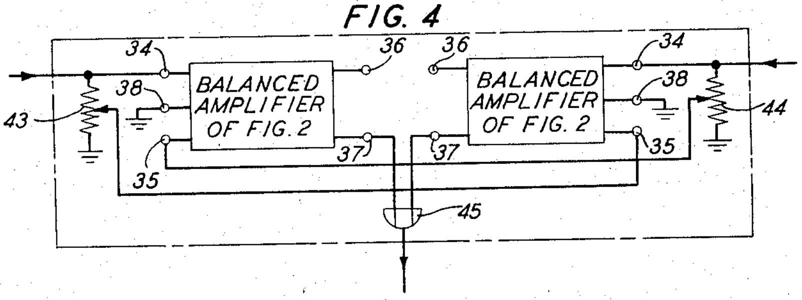

FIG. 4 shows one form of comparator that may be used in FIG. 1A. This comparator uses a pair of the balanced amplifiers of FIG. 2. Each amplifier receives a respective one of the comparator inputs at the amplifier input terminal 35 and a portion of the other comparator input, by way of a potentiometer 43 or 44, at the other amplifier input terminal. The outputs appearing at amplifier output terminals 37 are applied to an OR gate 45.

Under normal conditions, terminals 37 of FIG. 4 are at ground potential and the output of OR gate 45 is the binary zero state referred to with respect to FIG. 1B. When one of the comparator inputs rises by an amount determined by potentiometer settings, the amplifier to which a portion of that input is applied produces a positive voltage on its terminal 37. OR gate 45 then produces a binary one output. On the other hand, when that same comparator input decreases by an amount again determined by the potentiometer settings, the amplifier to which that input is directly applied produces a positive voltage at its output terminal 37. OR gate 45 will again produce a binary one output. Simultaneous and equal increases or decreases in the comparator inputs do not affect the levels on terminals 36. The comparator therefore produces a binary one output only when its inputs differ by predetermined amounts.

Figure 5:
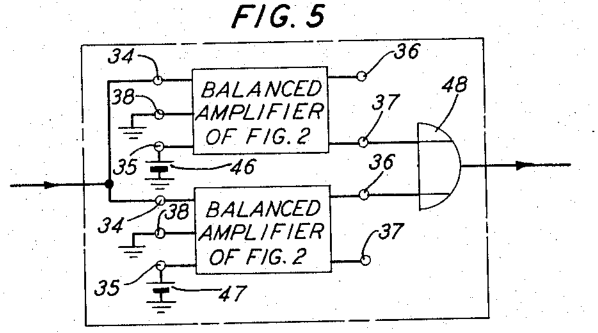

One form of limit detectors that may be used in FIG. 1A is shown in FIG. 5. This detector uses a pair of the balanced amplifiers shown in FIG. 2 with the detector input applied to input terminals 34 of the amplifiers. A grounded battery 46 is connected to terminal 35 of the upper amplifier while a grounded battery 47 is connected to terminal 35 of the lower amplifier. Finally, output terminal 37 of the upper amplifier and output terminal 36 of the lower amplifier are connected to an OR gate 48 whose output comprises the detector output.

Battery 46 of FIG. 5 is chosen so that its potential level is less than the normal level applied to input terminal 34 of the upper amplifier; output terminal 37 of the upper amplifier is therefore normally at ground potential. Battery 47, on the other hand, is chosen so that its potential level is greater than the normal level applied to input terminal 34 of the lower amplifier; output terminal 36 of the lower amplifier is therefore also at ground potential. Under these conditions the output of OR gate 48 is the binary zero referred to with respect to FIG. 1B. When the detector input level increases by an amount determined by battery 47, terminal 36 of the lower amplifier becomes positive and OR gate 48 produces a binary one output. On the other hand, when the detector input decreases by an amount determined by battery 46, terminal 37 of the upper amplifier becomes positive and OR gate 48 produces a binary one output. A binary one output is therefore produced whenever the input level falls outside of a predetermined range.

The combination used to describe the operation of the invention shows the phase-locking circuits connected to the outputs of shapers 13, 14 and 15. As appreciated by those skilled in the art, the combination operates in the same manner when the phase-locking circuits are directly connected to the oscillators.

Although only one embodiment of the invention has been described in detail, it is to be understood that various other embodiments may be devised by those skilled in the art without departing from the spirit and scope of the invention.

What is claimed is:

1. In a combination comprising a master-oscillator and first and second additional oscillators normally responsive to first and second phase-locking circuits, respectively, to phase lock said additional oscillators to said master-oscillator,
   - a comparator connected to said phase-locking circuits to produce an output when the phase-locking circuit outputs differ by a predetermined amount,
   - first and second limit detectors connected to said first and second phase-locking circuits, respectively, to produce outputs when the outputs of their phase-locking circuits occur outside of predetermined ranges,
   - first means connected to said first detector and said comparator to indicate the simultaneous occurrence of their outputs,
   - second means connected to said second detector and said comparator to indicate the simultaneous occurrence of their outputs, and
   - third means connected to both of said detectors to indicate the simultaneous occurrence of their outputs.

2. A combination in accordance with claim 1 in which said third means, in addition to indicating, causes at least one of said additional oscillators to be responsive to a reference voltage in place of its associated phase-locking circuit.

3. A combination in accordance with claim 1 in which said first and third means, in addition to indicating, inhibit the outputs from said first additional oscillator and said master-oscillator, respectively.

4. A combination in accordance with claim 2 in which said first and third means also inhibit the outputs from said first additional oscillator and said master-oscillator, respectively.

No references cited.

JOHN KOMINSKI, *Primary Examiner*.